United States Patent
Lin et al.

(10) Patent No.: US 7,626,878 B1
(45) Date of Patent: Dec. 1, 2009

(54) ACTIVE BIT LINE CHARGE KEEPER

(75) Inventors: Hwong-Kwo Lin, Palo Alto, CA (US); Ge Yang, Pleasanton, CA (US); Ethan A. Frazier, Sunnyvale, CA (US); Charles Chew-Yuen Young, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 11/838,818

(22) Filed: Aug. 14, 2007

(51) Int. Cl.
*G11C 7/12* (2006.01)

(52) U.S. Cl. ............ 365/207; 365/189.14; 365/189.15; 365/189.16; 365/189.19; 365/204

(58) Field of Classification Search ............... 365/204, 365/207, 222, 189.14, 189.15, 189.16
See application file for complete search history.

(56) References Cited

U.S. PATENT DOCUMENTS

| | | | | |
|---|---|---|---|---|
| 4,843,264 A | * | 6/1989 | Galbraith | 327/55 |
| 4,878,198 A | * | 10/1989 | Roy | 365/222 |
| 5,018,106 A | * | 5/1991 | Ul Haq et al. | 365/203 |
| 5,781,480 A | | 7/1998 | Nogle et al. | |
| 6,269,036 B1 | | 7/2001 | Shubat | |
| 6,335,873 B1 | * | 1/2002 | Kawaguchi et al. | 365/63 |
| 6,563,730 B1 | * | 5/2003 | Poplevine et al. | 365/154 |
| 6,882,562 B2 | | 4/2005 | Beucler | |
| 6,885,231 B2 | | 4/2005 | Kuppuswamy et al. | |
| 7,119,596 B2 | | 10/2006 | Kong et al. | |
| 7,349,285 B2 | | 3/2008 | Balasumramanian, et al. | |
| 7,529,139 B2 | | 5/2009 | Huang et al. | |
| 2006/0176729 A1 | * | 8/2006 | Chan et al. | 365/154 |

OTHER PUBLICATIONS

Office Action. U.S. Appl. No. 11/838,785 dated Jun. 18, 2009.

\* cited by examiner

*Primary Examiner*—Hoai V Ho
*Assistant Examiner*—Jay Radke
(74) *Attorney, Agent, or Firm*—Patterson & Sheridan, LLP

(57) ABSTRACT

One embodiment of the present invention sets forth an active bit line charge keeper circuit for improving the reliability of a static random access memory (SRAM) circuit. The active bit line charge keeper circuit includes two sub-circuits, each disposed between bit line pairs within the SRAM circuit. The first sub-circuit mitigates residual state associated with over-developed read state on the bit lines. The second sub-circuit mitigates the effects of residual state associated with reading one value on a given pair of bit lines and subsequently writing a different value. By mitigating the effects of residual state within an SRAM circuit, higher reliability at a given performance level may be achieved.

20 Claims, 9 Drawing Sheets

ACTIVE BIT LINE CHARGE KEEPER

BACKGROUND OF THE INVENTION

1. Field of the Invention

Embodiments of the present invention relate generally to static random access memory (SRAM) design and more specifically to an active bit line charge keeper.

2. Description of the Related Art

Integrated circuits commonly embed SRAM circuits to provide on-chip data storage. A given instance of an SRAM circuit typically includes, without limitation, an array of storage cells, write drivers, write column multiplexers, read column selectors, sense amplifiers, and address decoders. One common type of storage cell is a six-transistor ("6T") storage cell. A two-dimensional array of 6T storage cells allows one selected row of 6T storage cells to be accessed at a time, either for reading or writing data stored in the selected row. Pairs of bit lines typically provide access to data for each column within the row of 6T storage cells. Each pair of bit lines transmits a differential representation of the data stored within a corresponding 6T cell in the selected row. When data is driven by a low impedance column driver along the pair of bit lines, that data is written into the 6T cell. When the bit lines are not driven, data stored within the 6T cell may be sensed differentially from the pair of bit lines.

Each pair of bit lines is typically shared over a plurality of rows within the two-dimensional array for access to a given column over each row. As a result, access to a given row of data may leave the bit lines in a particular state (residual state) that may need to be overcome for a subsequent access to be successful. For example, a set of "1s" may be read from every element in a first row of 6T storage cells, followed by a write access to a second row of 6T storage cells containing all "0s." The state of the bit lines after the read access to the first row of 6T storage cells corresponds to all "1s," thereby requiring the write driver within the SRAM circuit to drive the bit lines through a sufficiently full transition from "1s" to "0s" in order for the data intended to be stored within the second row to be reliably written. The amount of time a bit line pair is subjected to a read or write operation determines the actual voltage swing on the bit line pair. In general, the optimal differential voltage for the bit line pair prior to the a read or write operation is actually much less than the full supply voltage. In fact, when a read or write operation is performed, the voltage levels on the bit line pair may stray too far high or low and become "over developed." Over developed bit line pairs may cause the SRAM circuit to become unreliable.

Person skilled in the art will recognize that for a given process technology, the upper performance limit of an SRAM circuit is typically defined by the ability of the SRAM circuit to overcome a residual bit line state, which is increasingly difficult at higher performance levels. Thus, as SRAM circuits are required to operate at progressively higher performance levels, reducing the effects of residual bit line state within the SRAM circuits becomes increasingly important as a determining factor of performance.

One solution to reducing the effects of residual bit line state within an SRAM circuit is to always fully restore the state of all bit lines to a known state prior to each access. This process is called "pre-charging." While pre-charging bit lines before each SRAM access provides reliable access, this technique is also time consuming and therefore potentially detrimental to the overall performance of an SRAM circuit. One approach to improving SRAM performance is to shorten the pre-charge time within the SRAM. However, this approach is highly sensitive to process variation and may result in an unacceptable drop in device yield.

As the foregoing illustrates, what is needed in the art is a technique for improving SRAM performance that is relatively insensitive to process variation.

SUMMARY OF THE INVENTION

One embodiment of the present invention sets forth a two-port static random access memory (SRAM) circuit. The memory circuit includes control logic configured to receive a reference clock signal and to transmit a read address, a write address and a read-write select signal, a shared address decoder configured to receive the read address, the write address and the read-write select signal from the control logic and to assert a word line signal, a single-port memory array configured to receive the asserted word line signal from the shared address decoder, and a read/write input/output unit configured to read data from and write data to the single-port memory array and including an active bit line charge keeper configured to reduce a first differential voltage developed on a first bit line and a second bit line during a read cycle.

One advantage of the disclosed memory circuit is that, by performing active charge keeping on the bit lines within the memory circuit, the sensitivity to process variation of the memory circuit is substantially reduced and overall yield may be improved.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
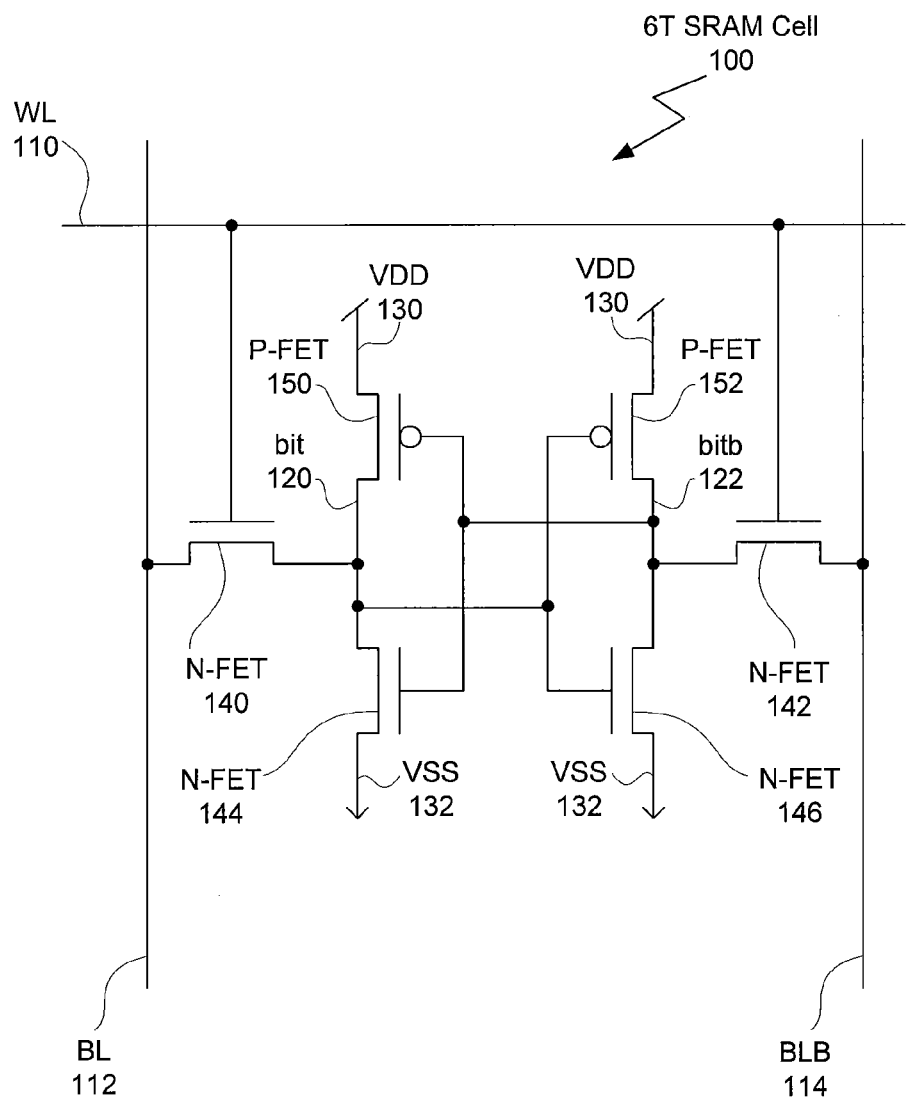
FIG. 1 illustrates the circuit design of a six-transistor (6T) static random access memory (SRAM) cell, according to one embodiment of the invention.

FIGS. 1 illustrates the circuit design of a six-transistor (6T) static random access memory (SRAM) cell 100, according to one embodiment of the invention. The 6T SRAM cell 100 includes two p-channel field effect transistors (P-FETs) 150, 152, four n-channel field effect transistors (N-FETs) 140, 142, 144 and 146. The 6T SRAM cell is connected to a word line (WL) 110, a bit line (BL) 112, and a bit line bar (BLB) 114.

P-FET 150 and N-FET 144 form a first logic inverter, with output bit 120. P-FET 152 and N-FET 146 form a second logic inverter, with output bitb 122. P-FETs 150 and 152 are connected to a positive supply voltage, conventionally called "VDD" 130 in complimentary symmetry metal-oxide semiconductor (CMOS) circuits. N-FETs 144 and 146 are connected to the zero-voltage reference node (or "ground"), conventionally called "VSS" 132 in CMOS circuits. The output of the first logic inverter, bit 120, is connected to the input of the second logic inverter, formed by the gate nodes of P-FET 152 and N-FET 146. The output of the second logic inverter, bitb 122, is connected to the input of the second logic inverter, formed by the gate nodes of P-FET 150 and N-FET 144. This configuration of the two inverters forms a one bit storage cell, including a two-stage high-gain feedback loop that provides stable storage of data. The one bit of data is represented in a positive sense on bit 120 and in a negative sense (inverted) form on bitb 122.

Data stored on bit 120 may be accessed on BL 112 through N-FET 140, when N-FET 140 is switched on. Similarly, data stored on bitb 122 may be accessed on BLB 114 through N-FET 142, when N-FET 142 is switched on. Both N-FETs 140 and 142 are switched on when the voltage on WL 110 is in a high state (close to voltage VDD). Both N-FETs 140 and 142 are switched off when the voltage on WL 110 is in a low state (close to voltage VSS). Thus, WL 110 may be used to selectively access the data stored on bit 120 and bitb 122.

Data may be read from or written to the 6T SRAM cell 100. When data is read from the 6T SRAM cell 100, WL 110 is asserted, causing bit 120 to be coupled to BL 112 and bitb 122 to be coupled to BLB 114. The voltage difference between BL 112 and BLB 114 is positive when the 6T SRAM cell 100 is storing a "1" and negative when the 6T SRAM cell 100 is storing a "0." Differential voltage sensing is used on BL 112 and BLB 114 to improve the performance and reliability.

When data is written to the 6T SRAM cell 100, WL 110 is asserted to couple bit 120 to BL 112 and bitb 122 to BLB 114. However, rather than sensing the resulting voltages on BL 112 and BLB 114, these lines are instead driven with the value of the write data. BL 112 is driven with the positive sense version of the write data and BLB 114 is driven with the negative sense (inverted) of the write data. Persons skilled in the art will recognize that BL 112 and BLB 114 should be driven with enough current to overcome the stable feedback loop of the two inverters. Additionally, N-FET 140 and N-FET 142 should provide sufficient conductivity to enable the flow of enough current to overcome the two inverters.

Figure 2:
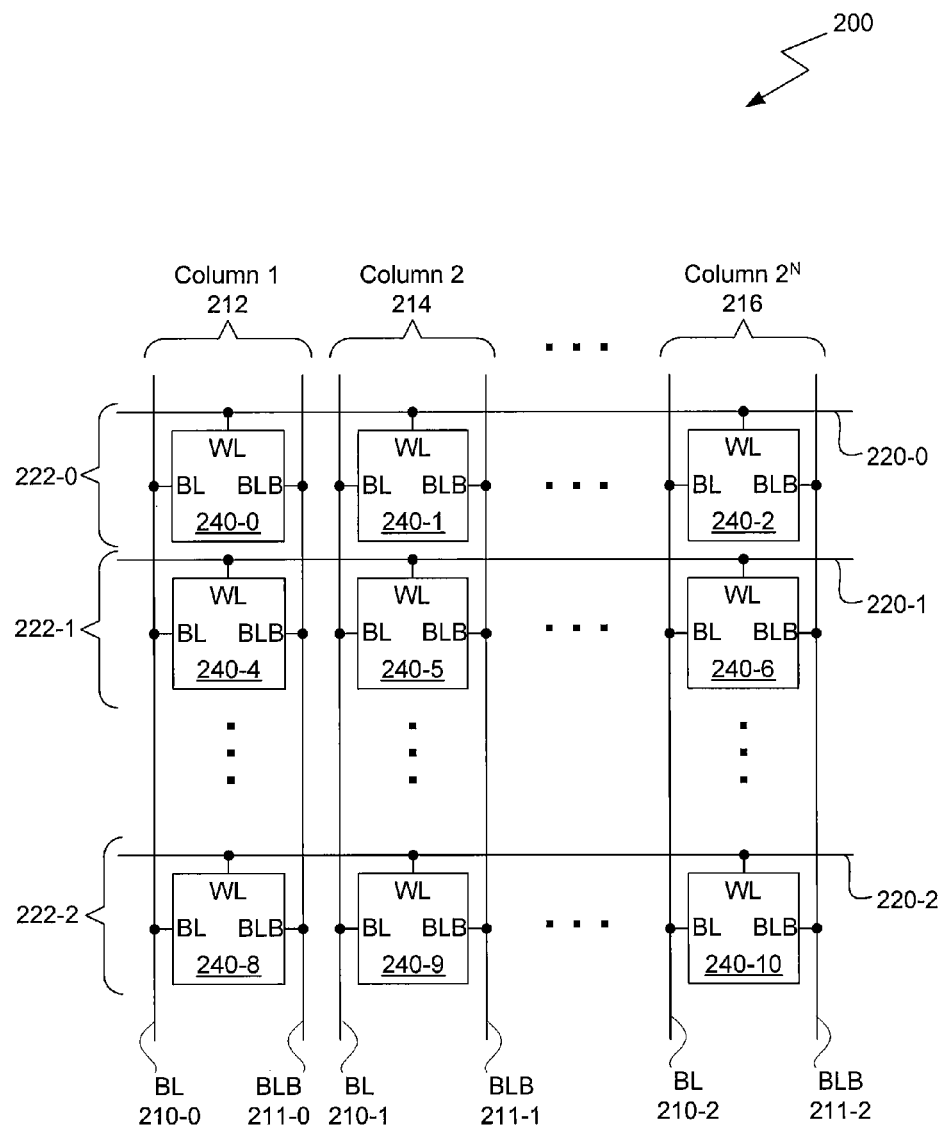
FIG. 2 depicts an array of 6T SRAM cells, according to one embodiment of the invention.

FIG. 2 depicts an array of 6T SRAM cells 200, according to one embodiment of the invention. The array of 6T SRAM cells 200 includes 6T SRAM cells 240, which are organized in a rectangular two-dimensional grid of rows and columns. The 6T SRAM cells 240 may be instances of the 6T SRAM cell 100 of FIG. 1. Word lines 220 run along the rows in the array. Each row 222 has a corresponding word line 220. For example, rows 222-0, 222-1 and 222-2 have corresponding to word lines 220-0, 220-1, 220-2, respectively. The word lines 220 connect to the WL ports of the 6T SRAM cells within the corresponding row. For example, word line 220-0 connects to each WL port of the 6T SRAM cells 240-0, 240-1 and 240-2 in row 222-0.

As shown, each column 212, 214, 216 has a corresponding pair of bit lines, called BL 210 and BLB 211. The bit lines, BL 210 and BLB 211, associated with each column connect to the BL and BLB ports of the 6T SRAM cells in the column. For example, column 212 has bit lines BL 210-0 and BLB 211-0, which connect to the BL and BLB ports of 6T SRAM cells 240-0 240-4 and 240-8.

The array of 6T SRAM cells 200 provides raw storage of data that is organized into rows, where each row (or "word") of data is selected for access using word lines 220 and each bit of data within the row is accessed using bit lines BL 210 and BLB 211. Circuitry to perform the actual read and write operations to the rows of data is discussed below in FIGS. 3 to 8.

Figure 3:
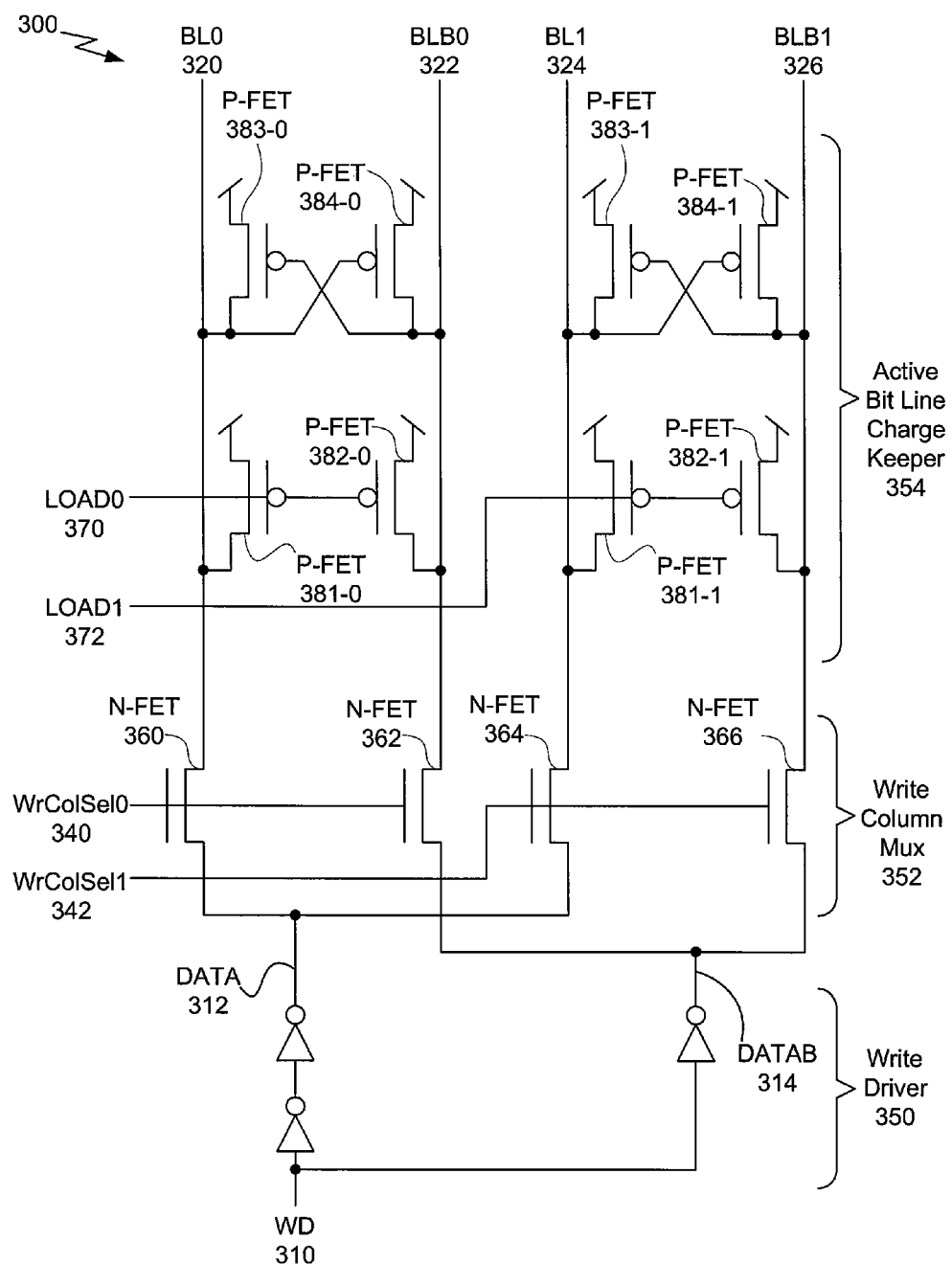
FIG. 3 illustrates the circuit design of a write path that incorporates an active bit line charge keeper, according to one embodiment of the invention.

FIG. 3 illustrates the circuit design of a write path 300 that incorporates an active bit line charge keeper 354, according to one embodiment of the invention. The write path 300 includes a write driver 350, a write column multiplexer 352 and the active bit line charge keeper 354.

The write driver 350 receives write data (WD) 310 and buffers the WD 310 to generate DATA 312 and DATAB 314. The DATA 312 signal is a buffered representation of WD 310, while the DATAB 314 signal is a buffered and inverted representation of WD 310.

The write column multiplexer 352 includes four N-FETs 360, 362, 364, 366 and two write column select controls WrColSel0 340 and WrColSel1 342. When WrColSel0 is active (high), N-FET 360 and N-FET 362 are both turned on, connecting DATA 312 to BL0 320, and DATAB 314 to BLB0 322. When WrColSel1 is active (high), N-FET 364 and N-FET 366 are both turned on, connecting DATA 312 to BL1 324, and DATAB 314 to BLB1 326. Both WrColSel0 and WrColSel1 should not be asserted active (high) simultaneously. In other embodiments, multiplexer ratios other than two-to-one may be implemented. For example, one or more than two write column selects may be used and one or more than two pairs of corresponding N-FETs would be used within the write column multiplexer to provide multiplexer ratios other than two-to-one.

Each pair of bit lines BL0 320, BLB0 322 and BL1 324, BLB1 326 has an associated charge keeper circuit within the active bit line charge keeper 354. Each charge keeper circuit includes four P-FETs 381, 382, 383, and 384 configured to perform two distinct sub-circuits with associated functions. The first function is performed by a sub-circuit that includes P-FETs 381 and 382. This function serves to restore the state of the corresponding bit lines to a known (high) state. The second function is performed by a sub-circuit that includes P-FETs 383 and 384. This function serves to widen any differential voltage on the corresponding bit lines.

The sub-circuit formed by P-FETs 381 and 382 assists in diminishing the effect of adjacent bit line over development by slowly collapsing bit line voltages towards VDD, while preserving any state (such as the read state held in a 6T cell) that may be on the bit lines. When a LOAD signal 370, 372 is asserted (active low), P-FETs 381 and 382 are turned on, causing the corresponding bit lines to be pulled to VDD. Importantly, the differential voltage across the bit lines tends to be preserved, although both bit lines are pulled towards VDD. When the LOAD signal 370, 372 is de-asserted (high), the P-FETs 381 and 382 turn off, allowing the corresponding bit lines to charge or discharge according to either the state of the write driver (for a write operation) or the state of the corresponding 6T cell (for a read operation). The LOAD signal 370, 372 should be held active (low), except during read or write operations.

The sub-circuit formed by P-FETs 383 and 384 assists in diminishing the effect of residual state for alternating state on the same bit line pair by modestly helping the 6T cell or the write driver achieve a differential state change. The P-FETs 383 and 384 form a cross-coupled differential "helper" amplifier. For example, when the voltage on BL0 320 is slightly lower than the voltage on BLB0 322, P-FET 384-0 is more conductive than P-FET 383-0, causing BLB0 322 to be pulled disproportionately to VDD by P-FET 384-0, thus widening the differential voltage across BL0 320 and BLB0 322. Similarly, when the voltage on BL0 320 is slightly higher than the voltage on BLB0 322, P-FET 383-0 is more conductive than P-FET 384-0, causing BL0 320 to be pulled disproportionately to VDD by P-FET 383-0, thus widening the differential voltage in the prevailing polarity.

Figure 4:
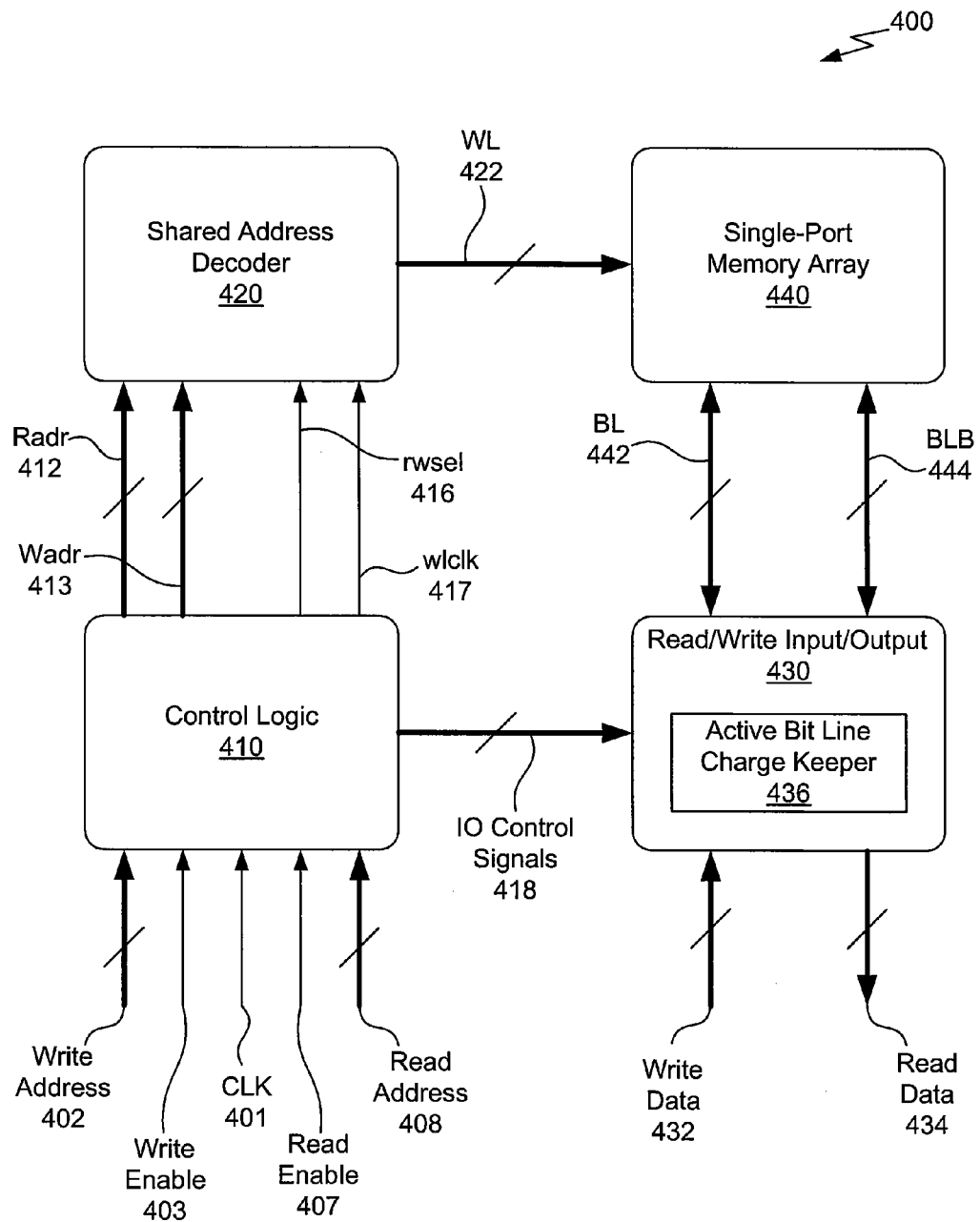
FIG. 4 depicts a two-port SRAM circuit, according to one embodiment of the invention.

FIG. 4 depicts a two-port SRAM circuit 400, according to one embodiment of the invention. The two-port SRAM circuit 400 includes control logic 410, a shared address decoder 420, a read/write input/output unit 430, and a single-port memory array 440. The two-port SRAM circuit 400 has inputs including a write address 402, a write enable 403, a clock (CLK) 401, a read enable 407, a read address 408, and write data 432. The two-port SRAM circuit 400 also includes a read data 434 output signal. The overall implementation of the two-port SRAM circuit 400 is described in the U.S. patent application titled "Sequentially-Accessed 1R/1W double-pumped single port SRAM with shared decoder architecture," filed on Aug. 14, 2007 and having the U.S. patent application Ser. No. 11/838,785. The subject matter of this related application is hereby incorporated herein by reference.

The control logic 410 may include any timing generation circuitry used to generate certain control signals used by the shared address decoder 420 and the read/write input/output unit 430. Many of these control signals may be generated by a timer unit described in the U.S. patent application titled "Generic Flexible Timer Design," filed on Aug. 13, 2007 and having the U.S. patent application Ser. No. 11/838,171. The subject matter of this related application is hereby incorporated herein by reference.

The shared address decoder 420 receives a read address (Radr) 412, a write address (Wadr) 413, a read-write select (rwsel) 416, and a word line clock (wlclk) 417. The shared address decoder 420 generates a set of word line (WL) select signals 422, based on either the Radr 412 or Wadr 413, addresses as selected by the rwsel 416 signal. The result of decoding the selected address is that only one of the WL 422 signals should be asserted at any one time, based on the selected address. The address selection process and the behavior of the shared address decoder 420 will be discussed in greater detail in FIGS. 7 and 8.

The single-port memory array 440 is an instance of the array of 6T SRAM cells 200 from FIG. 2 coupled to the shared address decoder 420 and the read/write input/output unit 430. The single-port memory array 440 receives word lines 422 from the shared decoder 420, and exposes bit lines BL 442 and BLB 444 to the read/write input/output unit 430.

The read/write input/output unit 430 includes one or more instances of the write path 300 from FIG. 3, including an active bit line charge keeper 436. The read path and write path 300 circuitry are coupled to the bit lines from the array of 6T SRAM cells 200. The read path transmits resulting data to the read data 434 output of the read/write input/output unit 430.

The write path 300 receives data from the write data 432 input of the read/write input/output unit 430. The read path and write path 300 circuitry receive timing control from the control logic 410 through the I/O control signals 418.

Figure 5A:
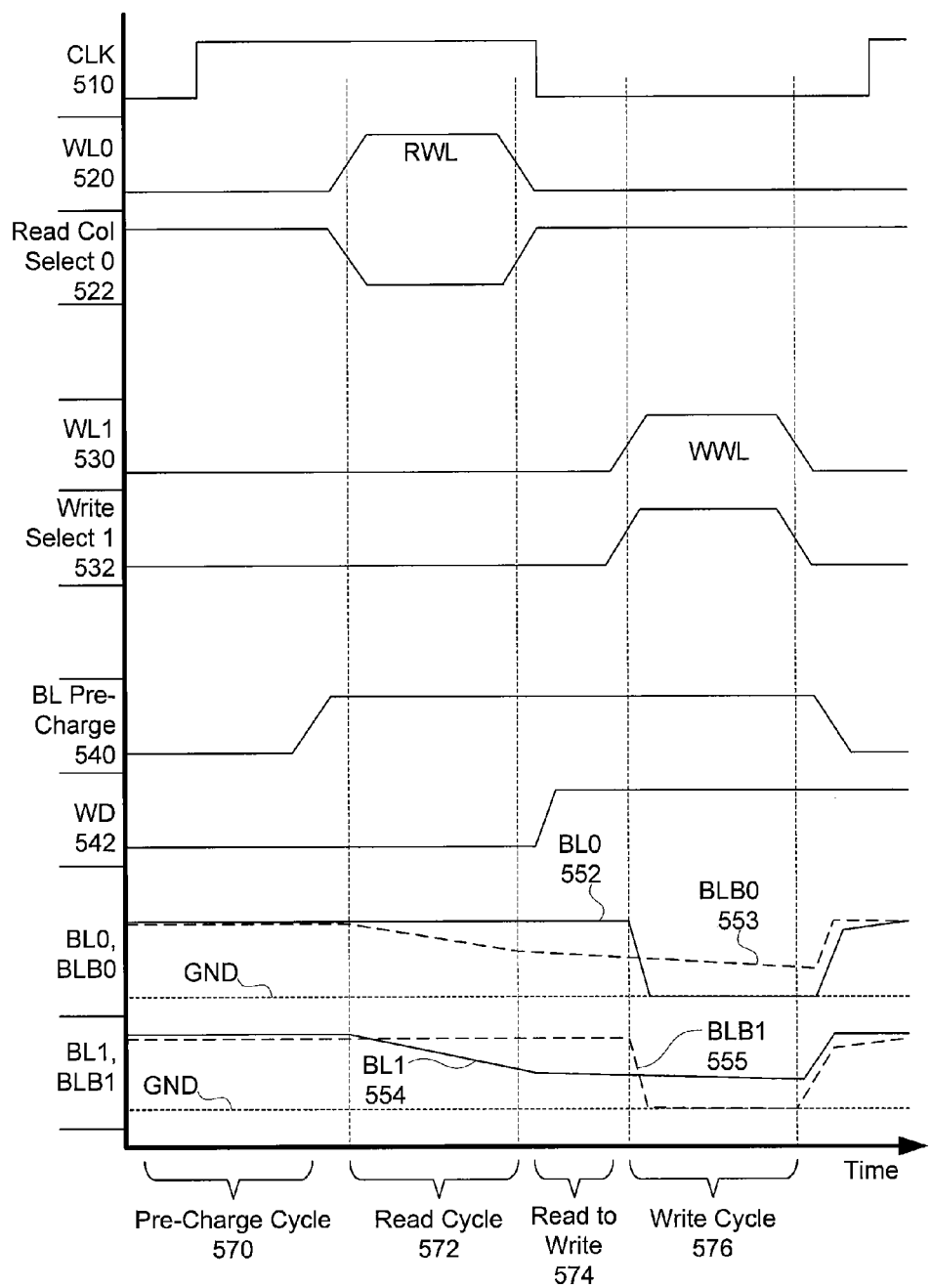
FIG. 5A illustrates timing signals used to control the operation of the two-port SRAM circuit and the resulting bit line waveforms without the benefit of the active bit line charge keeper.

FIG. 5A illustrates timing signals used to control the operation of the two-port SRAM circuit 400 and the resulting bit line waveforms without the benefit of the active bit line charge keeper 436. In this case, a read operation is performed on one set of bit lines, and a write is performed on a second set of bit lines. During the read operation, both sets of bit lines are driven by their corresponding 6T cell.

A clock signal, CLK 510 is used as the timing reference for the other signals. Initially, a pre-charge cycle 570 is performed to charge any bit lines to a known state of VDD. A bit line (BL) pre-charge signal 540 is active low during this time. A word line select WL0 520 is used to select a row of 6T cells for access. In this case a read word line (RWL) select is performed for a read access. A read column select 0 522, which is active low, is asserted during a read cycle 572 to multiplex one of two or more bit line pairs to a sense amplifier for reading. A read to write transition time 574 may be defined between the read cycle 572 and a subsequent write cycle 576. Before this cycle, write data 542 may be held in a flip-flop in a write driver, such as write driver 350 of FIG. 3, to drive the bit lines.

Word line 1 530 may be asserted to select a different set of bit lines for writing in the write cycle 576 than the bit lines selected for reading in the read cycle 572. A write select 1 532 signal, corresponding to the WrColSel 1 342, may be asserted to select which bit lines to drive with the write driver 350.

During the read cycle, BL0 552 and BLB0 553 develop a differential voltage, as consequence of the read operation. Additionally, BL1 554 and BLB1 555 also develop a differential voltage during the read operation because each 6T cell enabled by the active word line WL0 520 drive their corresponding bit lines, regardless of which bit lines are subsequently sampled for reading. Therefore, after the read cycle, bit lines BL1 554 and BLB1 555 have a differential voltage that the write driver 350 needs to overcome in order to successfully write data into a selected 6T cell. With a sufficiently over developed differential voltage on bit lines BL1 554 and BLB1 555, a 6T cell that shares bit lines BL1 554 and BLB1 555 may be erroneously written if the corresponding row is selected, even bit lines BL1 554 and BLB1 555 were not driven by an explicit write operation.

Figure 5B:
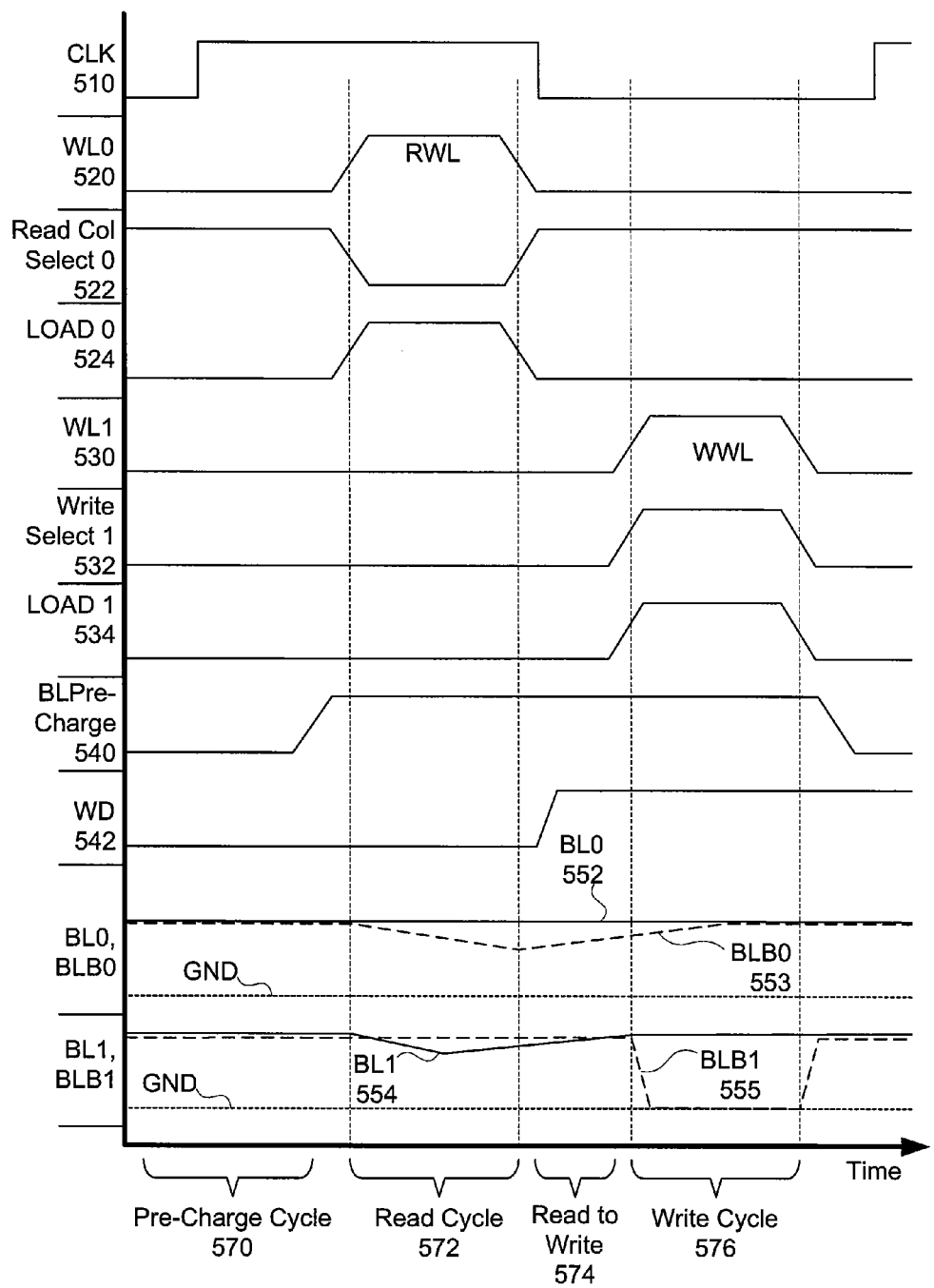
FIG. 5B illustrates timing signals used to control the operation of the two-port SRAM circuit and the resulting bit line waveforms using the active bit line charge keeper, according to one embodiment of the invention.

FIG. 5B illustrates timing signals used to control the operation of the two-port SRAM circuit 400 and the resulting bit line waveforms using the active bit line charge keeper 436, according to one embodiment of the invention. The control signals from FIG. 5A are maintained in FIG. 5B, however the load signals LOAD 0 524 and LOAD 1 534 are added. During the read cycle 572, LOAD 0 524 is de-asserted to a high state to allow the 6T cells in the selected row to drive the bit lines for reading. During the write cycle 576, LOAD 1 534 is de-asserted to a high state to allow the write driver 350 of FIG. 3 to drive the selected bit lines unhindered. During the read cycle 572, bit lines BL0 552 and BLB0 553 are able to develop a sufficient differential voltage to be read. Simultaneously, bit lines BL1 554 and BLB1 555 also develop a differential voltage, which is attenuated by clamping both bit lines to a voltage close to VDD during the read cycle using P-FETs 381 and 382 within the active bit line charge keeper 354. By reducing the residual differential voltage on bit lines BL1 554 and BLB1 555, the write driver 530 can more easily drive the bit lines to specified voltage levels during the write cycle 576, rather than having to first over come residual state stored on the bit lines, as shown in FIG. 5A.

Figure 6A:
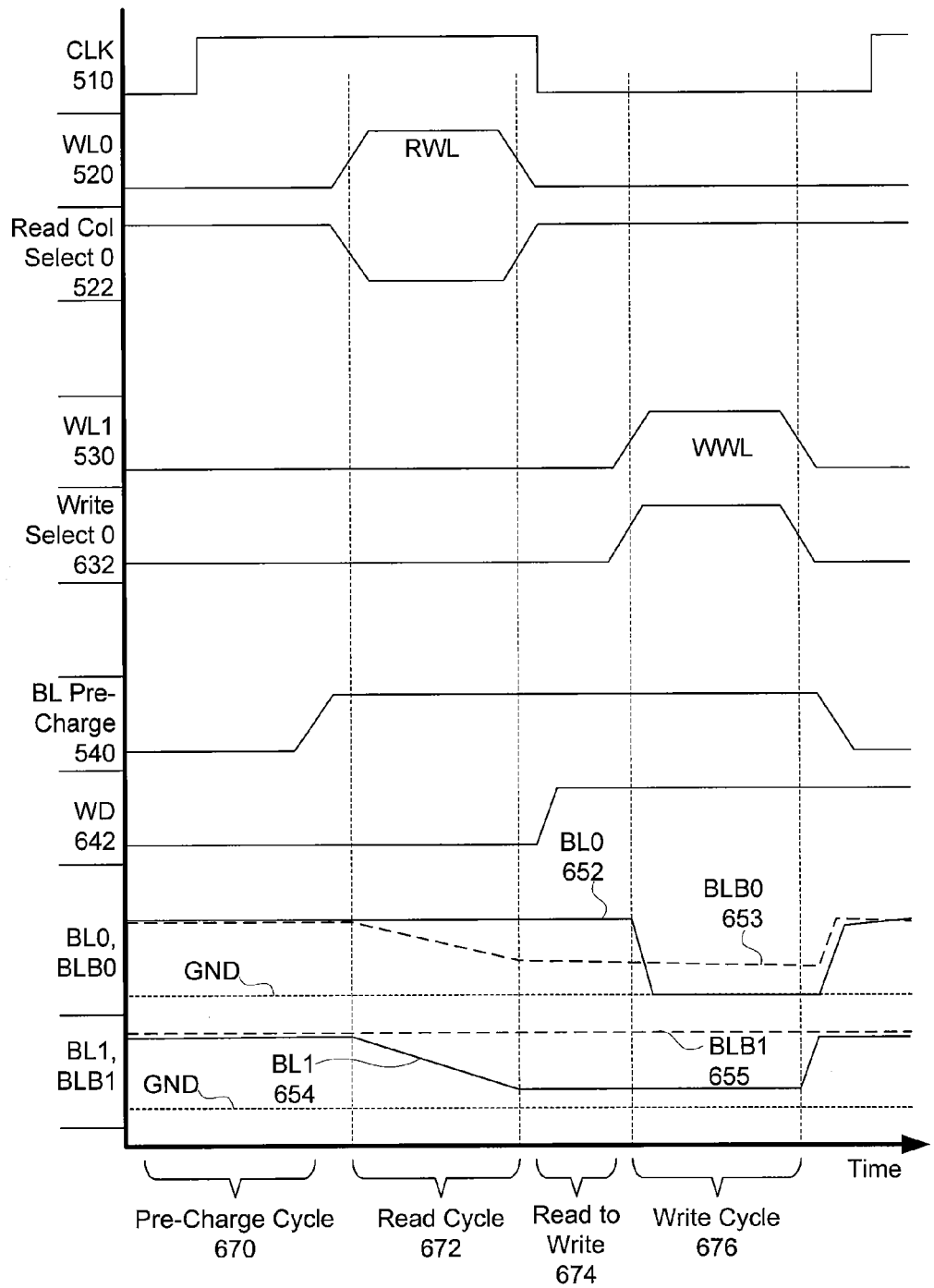
FIG. 6A illustrates timing signals used to control the operation of the two-port SRAM circuit and the resulting bit line waveforms without the benefit of the active bit line charge keeper.

FIG. 6A illustrates timing signals used to control the operation of the two-port SRAM circuit 400 and the resulting bit line waveforms without the benefit of the active bit line charge keeper 436. In this case, a read operation is performed on one set of bit lines, and a write is performed on the same set of bit lines. The control signals from FIG. 5A are maintained in FIG. 6A, however write select 0 632 is added. The relevant signals are BL 0 652 and BLB0 653, which participate in both a read cycle 672 and a write cycle 676. A pre-charge cycle 670 is executed prior to the read cycle 672. A read to write transition time 674 may be defined between the read cycle 672 and the write cycle 676. During the read cycle, BL0 652 and BLB0 653 are charged according to the state of a corresponding 6T cells. During the write cycle 676, this charge needs to be overcome to successfully write the 6T cells.

Figure 6B:
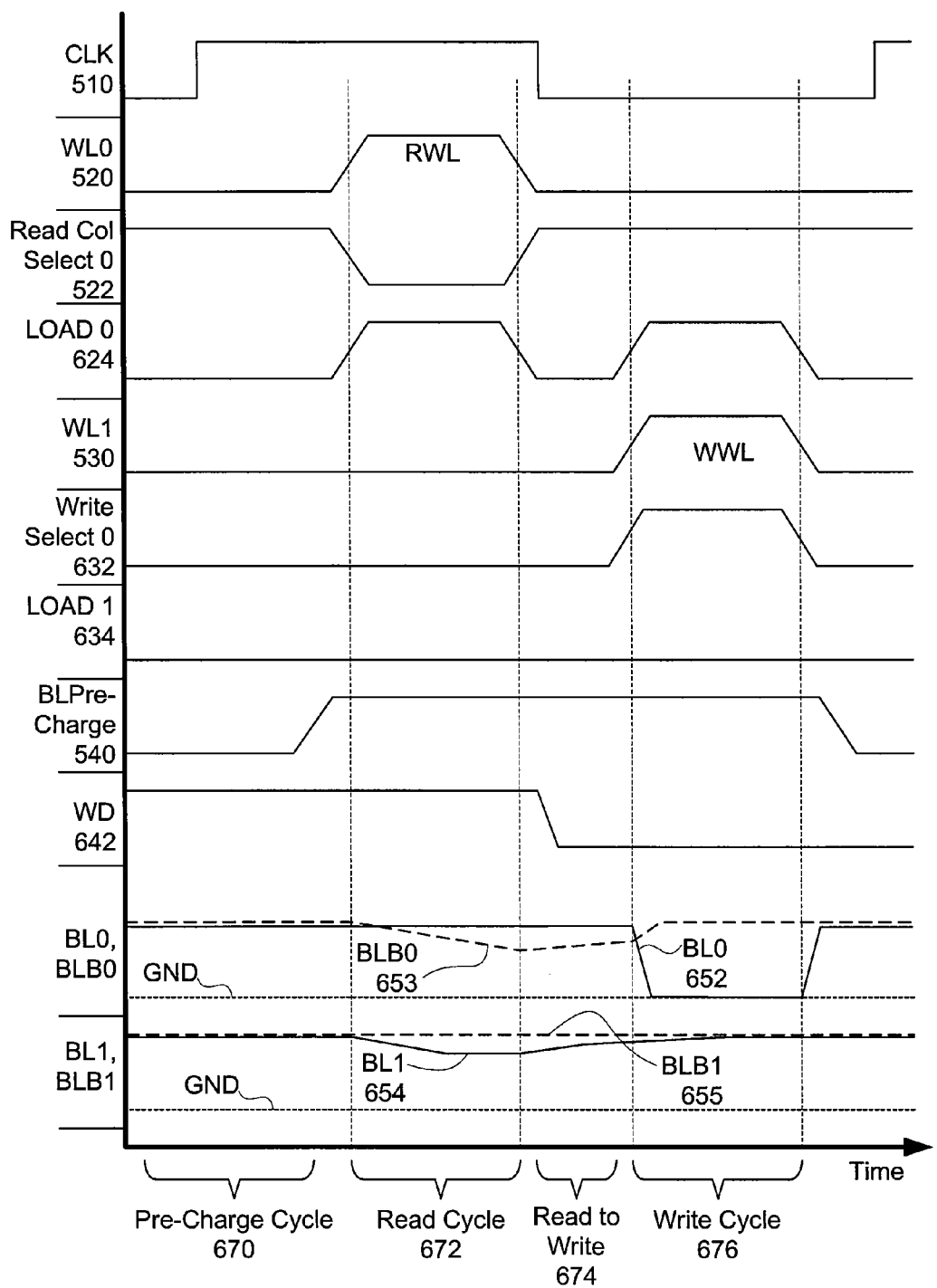
FIG. 6B illustrates timing signals used to control the operation of the two-port SRAM circuit and the resulting bit line waveforms using the active bit line charge keeper, according to one embodiment of the invention.

FIG. 6B illustrates timing signals used to control the operation of the two-port SRAM circuit 400 and the resulting bit line waveforms using the active bit line charge keeper 436, according to one embodiment of the invention. The control signals from FIG. 6A are maintained in FIG. 6B, however the load signals LOAD 0 624 and LOAD 1 634 are added. During the read cycle 672, LOAD 0 624 is de-asserted to a high state to allow the 6T cells in the selected row to drive the bit lines for reading. During the write cycle 676, LOAD 0 624 is again de-asserted to a high state to allow the write driver 350 of FIG. 3 to drive the selected bit lines unhindered. During the read cycle 672, bit lines BL0 652 and BLB0 653 are able to develop sufficient differential voltage to be read. During a subsequent write cycle, P-FETs 383 and 384 within the active bit line charge keeper 354, help to amplify a differential write voltage on the selected bit lines, thereby reducing the effect of residual state on bit lines from a previous read.

Figure 7:
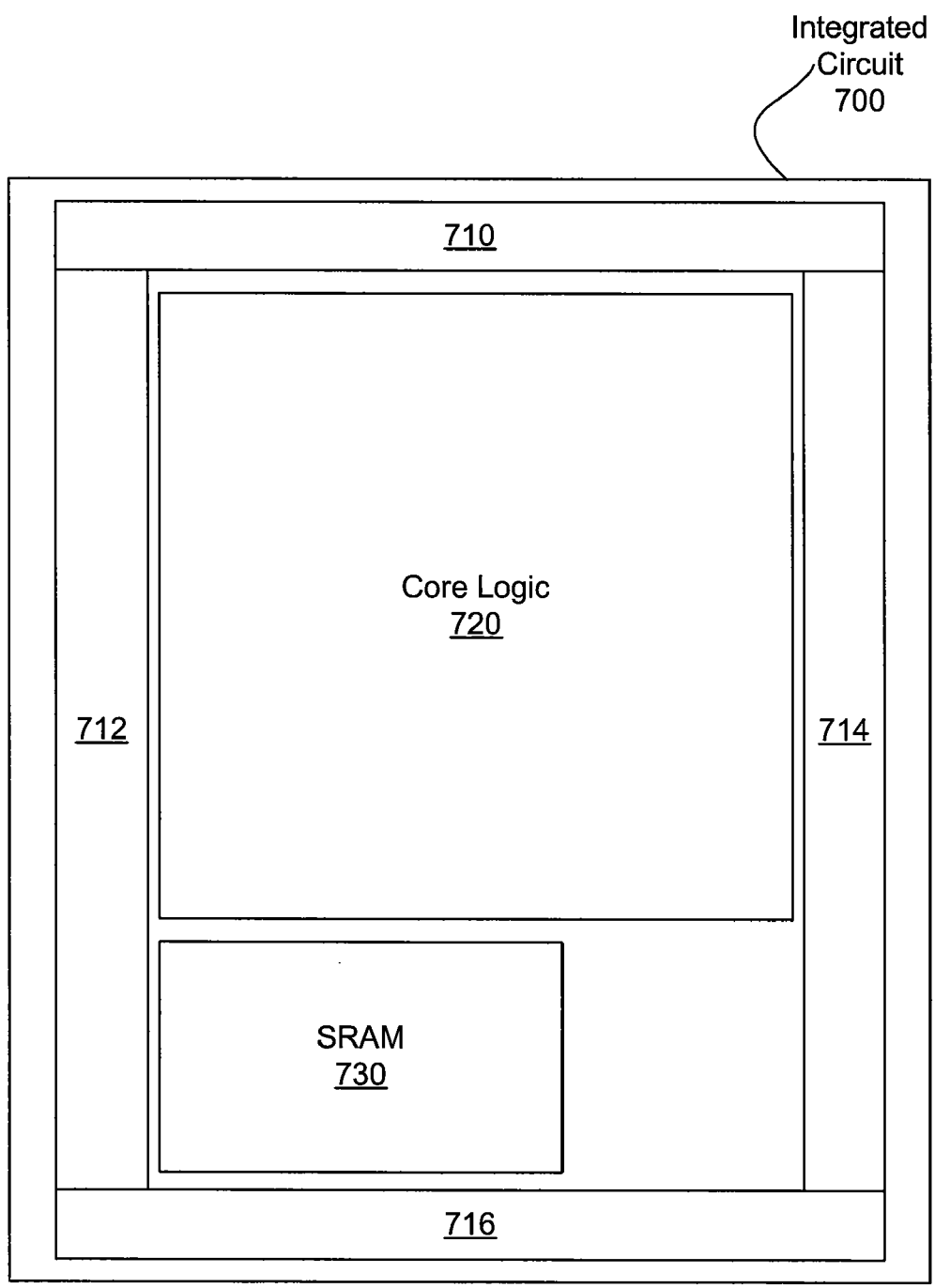
FIG. 7 depicts an integrated circuit in which one or more aspects of the invention may be implemented.

FIG. 7 depicts an integrated circuit 700 in which one or more aspects of the invention may be implemented. The integrated circuit 700 includes input/output circuits 710, 712, 714 and 716, as well as core logic 720. The integrated circuit 700 also includes at least one SRAM 730. The SRAM 730 includes one or more instances of a two-port SRAM circuit 400 from FIG. 4.

In sum, an active charge keeper for use within an SRAM circuit is disclosed. The active charge keeper includes two sub-circuits. The first sub-circuit includes two P-FETs, each connected between VDD and their respective bit line. The first sub-circuit is controlled by a load signal that is generated by a timer circuit used to control the overall activity within the SRAM circuit. The first sub-circuit clamps both bit lines to a voltage close to VDD to mitigate over development of charge during a read. The second sub-circuit includes two P-FETs, each connected between VDD and their respective bit line. This second sub-circuit is controlled by the state on a given pair bit lines and "assists" the bit lines during a write access when the bit lines need to change state in order to write a different value than was previously just read. By performing active charge keeping on the bit lines within the SRAM circuit, the sensitivity to process variation of the SRAM circuit is substantially reduced and overall yield improved.

While the forgoing is directed to embodiments of the present invention, other and further embodiments of the invention may be devised without departing from the basic scope thereof. For example, aspects of the present invention may be implemented in hardware or software or in a combination of hardware and software. Therefore, the scope of the present invention is determined by the claims that follow.

We claim:

1. A two-port static random access memory (SRAM) circuit, comprising:

control logic configured to receive a reference clock signal and to transmit a read address, a write address and a read-write select signal;

a shared address decoder configured to receive the read address, the write address and the read-write select signal from the control logic and to assert a word line signal;

a single-port memory array configured to receive the asserted word line signal from the shared address decoder; and a read/write input/output unit configured to read data from and write data to the single-port memory array and including an active bit line charge keeper configured to increase a second differential voltage between the first bit line and the second bit line to achieve a differential state change and reduce a first differential voltage developed on a first bit line and a second bit line during a read cycle by activating a first transistor and a second transistor, wherein the first transistor is coupled between the first bit line and the positive supply voltage and the second transistor is coupled between the second bit line and the positive supply voltage with a gate of the first transistor coupled to a gate of the second transistor to restore the first bit line and the second bit line between read and write cycles.

2. The memory circuit of claim 1, wherein a first load signal is input into the active bit line charge keeper to control the first bit line and the second bit line, and a second load signal is input into the active bit line charge keeper to control a third bit line and a fourth bit line.

3. The memory circuit of claim 2, wherein the second load signal is de-asserted during the read cycle, and the first load signal is de-asserted during a write cycle.

4. The memory circuit of claim 3, wherein a third differential voltage sufficient to be read develops between the third bit line and the fourth bit line during the read cycle.

5. The memory circuit of claim 4, wherein the first differential voltage developed on the first bit line and the second bit line during the read cycle is attenuated during the read cycle by the active bit line charge keeper.

6. The memory circuit of claim 5, wherein the active bit line charge keeper is configured to clamp the first bit line and the second bit line to drive the first bit line and the second bit line to a voltage level closer to the positive supply voltage during the read cycle.

7. The memory circuit of claim 2, wherein the second load signal is de-asserted during the read cycle and de-asserted during a write cycle.

8. The memory circuit of claim 4, wherein the active bit line charge keeper is configured to increase the third differential voltage developed between the third bit line and the fourth bit line during the read cycle.

9. An integrated circuit, comprising:

a plurality of input/output circuits;

core logic; and a static random access memory (SRAM) unit that includes a two-port SRAM circuit that comprises:

control logic configured to receive a reference clock signal and to transmit a read address, a write address and a read-write select signal;

a shared address decoder configured to receive the read address, the write address and the read-write select signal from the control logic and to assert a word line signal;

a single-port memory array configured to receive the asserted word line signal from the shared address decoder; and a read/write input/output unit configured to read data from and write data to the single-port memory array and including an active bit line charge keeper configured to increase a second differential voltage between the first bit line and the second bit line to achieve a differential state change and to reduce a first differential voltage developed on a first bit line and a second bit line during a read cycle by activating a first transistor and a second transistor, wherein the first transistor is coupled between the first bit line and the positive supply voltage and the second transistor is coupled between the second bit line and the positive supply voltage with a gate of the first transistor coupled to a gate of the second transistor to restore the first bit line and the second bit line between read and write cycles.

10. The integrated circuit of claim 9, wherein a first load signal is input into the active bit line charge keeper to control the first bit line and the second bit line, and a second load signal is input into the active bit line charge keeper to control a third bit line and a fourth bit line.

11. The integrated circuit of claim 10, wherein the second load signal is de-asserted during the read cycle, and the first load signal is de-asserted during a write cycle.

12. The integrated circuit of claim 11, wherein a third differential voltage sufficient to be read develops between the third bit line and the fourth bit line during the read cycle.

13. The integrated circuit of claim 12, wherein the first differential voltage developed on the first bit line and the second bit line during the read cycle is attenuated during a read cycle by the active bit line charge keeper.

14. The integrated circuit of claim 13, wherein the active bit line charge keeper is configured to clamp the first bit line and the second bit line to drive the first bit line and the second bit line to a voltage level closer to the positive supply voltage during the read cycle.

15. The integrated circuit of claim 10, wherein the second load signal is de-asserted during the read cycle and de-asserted during a write cycle.

16. The integrated circuit of claim 12, wherein the active bit line charge keeper is configured to increase the third differential voltage developed between the third bit line and the fourth bit line during the read cycle.

17. The memory circuit of claim 7, wherein the first load signal is asserted to reduce the first differential voltage developed on the first bit line and the second bit line during the read cycle.

18. The integrated circuit of claim 15, wherein the first load signal is asserted to reduce the first differential voltage developed on the first bit line and the second bit line during the read cycle.

19. The memory circuit of claim 1, wherein the first transistor is coupled between the first bit line and the positive supply voltage with a gate of the first transistor coupled to the second bit line and the second transistor is coupled between the second bit line and the positive supply voltage with a gate of the second transistor coupled to the first bit line.

20. The integrated circuit of claim 9, wherein the first transistor is coupled between the first bit line and the positive supply voltage with a gate of the first transistor coupled to the second bit line and the second transistor is coupled between the second bit line and the positive supply voltage with a gate of the second transistor coupled to the first bit line.

* * * * *